(12) United States Patent
Chen et al.

(10) Patent No.: US 8,749,020 B2
(45) Date of Patent: Jun. 10, 2014

(54) METAL E-FUSE STRUCTURE DESIGN

(75) Inventors: Hsien-Wei Chen, Sinying (TW); Hao-Yi Tsai, Hsin-Chu (TW); Shin-Puu Jeng, Hsin-Chu (TW); Shih-Hsun Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 774 days.

(21) Appl. No.: 11/716,206

(22) Filed: Mar. 9, 2007

(65) Prior Publication Data

US 2008/0217735 A1  Sep. 11, 2008

(51) Int. Cl.
*H01L 29/00* (2006.01)

(52) U.S. Cl.
USPC ........... 257/529; 257/50; 257/209; 257/530; 257/E23.147; 257/E23.149; 438/132; 337/158; 337/159; 337/296; 337/297

(58) Field of Classification Search
USPC ......... 337/158, 159, 296, 297; 257/529, 536, 257/50, 209, 530, E23.147, E23.149; 438/132

See application file for complete search history.

(56) References Cited

U.S. PATENT DOCUMENTS

| | | | | |
|---|---|---|---|---|
| 5,367,280 A | * | 11/1994 | Thiel et al. | 337/297 |
| 5,589,706 A | * | 12/1996 | Mitwalsky et al. | 257/529 |
| 5,882,998 A | * | 3/1999 | Sur et al. | 438/601 |
| 5,914,524 A | * | 6/1999 | Komenaka | 257/529 |
| 6,100,116 A | * | 8/2000 | Lee et al. | 438/128 |
| 6,100,118 A | * | 8/2000 | Shih et al. | 438/132 |
| 6,162,686 A | * | 12/2000 | Huang et al. | 438/281 |
| 6,271,574 B1 | * | 8/2001 | Delpech et al. | 257/529 |
| 6,376,913 B1 | * | 4/2002 | Buck | 257/775 |
| 6,555,458 B1 | * | 4/2003 | Yu | 438/601 |
| 6,566,730 B1 | * | 5/2003 | Giust et al. | 257/529 |
| 6,661,330 B1 | * | 12/2003 | Young | 337/297 |
| 6,774,457 B2 | | 8/2004 | Appel | |
| 7,382,036 B2 | * | 6/2008 | Nowak et al. | 257/529 |
| 2002/0027443 A1 | * | 3/2002 | Rincon et al. | 324/754 |

* cited by examiner

*Primary Examiner* — Matthew W Such
*Assistant Examiner* — Stephen C Smith
(74) *Attorney, Agent, or Firm* — Steven H. Slater

(57) ABSTRACT

An integrated circuit structure is provided. The integrated circuit structure includes a semiconductor substrate; a dielectric layer over the semiconductor substrate; a metal fuse in the dielectric layer; a dummy pattern adjacent the metal fuse; and a metal line in the dielectric layer, wherein a thickness of the metal fuse is substantially less than a thickness of the metal line.

24 Claims, 7 Drawing Sheets

METAL E-FUSE STRUCTURE DESIGN

TECHNICAL FIELD

This invention relates generally to semiconductor structures, and more particularly to electrical fuses and a fabrication method thereof.

BACKGROUND

In the semiconductor industry, fuse elements are widely used in integrated circuits for a variety of purposes, such as improving manufacturing yield or customizing generic integrated circuits. For example, by replacing defective circuits on a chip with duplicate or redundant circuits on the same chip, manufacturing yields can be significantly increased. A fuse disconnected by a laser beam is referred to as a laser fuse, while a fuse disconnected by passing an electrical current, or blowing, is referred to as an electrical fuse, or e-Fuse. By selectively blowing fuses within an integrated circuit, which has multiple potential uses, a generic integrated circuit design may be economically manufactured and adapted to a variety of customer uses.

Typically, fuses are incorporated in the design of the integrated circuits, wherein the fuses are selectively blown, for example, by passing an electrical current of a sufficient magnitude to cause electro-migration or melting, thereby creating a more resistive path or an open circuit. Alternatively, a current that is weaker than the current required to entirely blow a fuse can be applied to the fuse in order to degrade the fuse, thus increasing a resistance through the fuse. The process of selectively blowing or degrading fuses is often referred to as "programming."

FIG. 1 illustrates a perspective view of a commonly formed electrical fuse, which includes metal line 2, also referred to as fuse element 2, connected to contact pads 4. Contact pads 4 have a significantly greater width than fuse element 2. Fuse element 2 and contact pads 4 are formed in one of the metallization layers. Each of the contact pads 4 may be connected to metal lines in overlying metallization layers through a plurality of vias (not shown). The total cross-sectional area of the vias and the cross-sectional area of contact pads 4 are substantially greater than the cross-sectional area of fuse element 2. Therefore, when a blowing current is conducted, fuse element 2 has a greater current density than the vias and contact pads 4, and thus is blown.

In order to reliably blow the fuse, fuse element 2 preferably has a small cross-sectional area, so that the respective current density, hence Joule effect, is high. The cross-sectional area of fuse element 2 can be reduced by reducing width W and/or thickness T. Currently, the width W of e-Fuses has been reduced to about 0.1 μm or less, and thus there is little room, if any, for further improvement. On the other hand, since fuse element 2 and contact pads 4 are formed in one of the metallization layers, the thickness T equals the thickness of the respective metallization layer. Thickness T, therefore, cannot be customized to satisfy the requirement of e-Fuses. This limits the reduction of the blowing current. A novel fuse structure and methods for forming the same are thus needed.

SUMMARY OF THE INVENTION

In accordance with one aspect of the present invention, an integrated circuit structure includes a semiconductor substrate; a dielectric layer over the semiconductor substrate; a metal fuse in the dielectric layer; a dummy pattern adjacent the metal fuse; and a metal line in the dielectric layer, wherein a thickness of the metal fuse is substantially less than a thickness of the metal line.

In accordance with another aspect of the present invention, an integrated circuit structure includes a dielectric layer and a metal fuse in the dielectric layer. The metal fuse includes a metal fuse element and a contact pad physically connected to the metal fuse element. The integrated circuit structure further includes a dummy pattern adjacent the metal fuse element; and a local fuse region comprising the metal fuse element, the dummy pattern, and the contact pad therein, wherein the local fuse region has a pattern density of greater than about 75 percent.

In accordance with yet another aspect of the present invention, an integrated circuit structure includes a dielectric layer and a metal fuse in the dielectric layer, wherein the metal fuse comprises a metal fuse element and two contact pads each physically connected to an end of the metal fuse element. The integrated circuit structure further includes a local fuse region defined by extending outer edges of the contact pads, wherein the local fuse region comprises spaces not filled by the metal fuse element and the contact pads; and dummy patterns in the dielectric layer and filling substantially all of the spaces, wherein the dummy patterns are separated from the metal fuse element and the contact pads.

By increasing the pattern density of local fuse regions, metal fuses formed in the local fuse regions may have reduced thicknesses, and thus the cross-sectional areas of the metal fuse elements are reduced. Accordingly, the required blowing currents of the metal fuses are reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
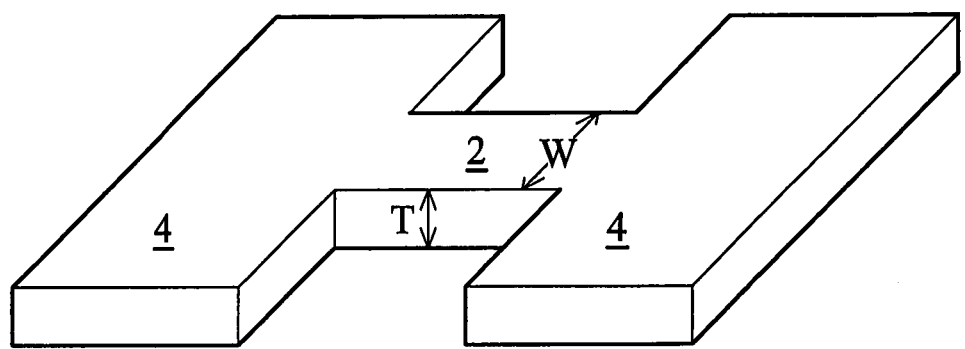
FIG. 1 illustrates a conventional metal fuse, wherein a fuse element is formed between two contact pads.
Figure 2:
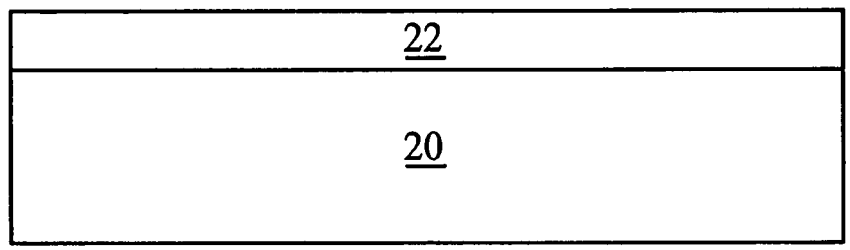
FIGS. 2 through 6 are top views and cross-sectional views of intermediate stages in the manufacturing of an embodiment of the present invention.

FIG. 2 illustrates a starting structure, which includes a schematically illustrated base layer 20 and overlying dielectric layer 22. Base layer 20 may include a semiconductor substrate (not shown). Other layers, such as a contact etch stop layer, an inter-layer dielectric, and an inter-metal dielectrics (not shown), may also be included in base layer 20. The semiconductor substrate may be a single crystalline or a compound semiconductor substrate. Active devices (not shown) such as transistors may be formed on the semiconductor substrate. In an embodiment, redundant circuits are formed on semiconductor substrates and are connected to the subsequently formed metal fuse.

In the preferred embodiment, dielectric layer 22 is an inter-metal dielectric layer, and thus has a low dielectric constant (k value), for example, lower than about 3.0. As such, dielectric layer 22 is alternatively referred to as low-k dielectric layer 22 throughout the description. As is known in the art, low-k dielectric layer 22 may include commonly used materials such as carbon-containing dielectric materials, and may further contain nitrogen, hydrogen, oxygen, and combinations thereof. Porous materials are preferably used for lowering the k value of low-k dielectric layer 22. Preferably, dielectric layer 22 is the same dielectric layer for forming metallization layer one (M1), which is the lowest metallization layer, although it can be the metallization layers overlying M1. Advantageously, conductive features in M1 may have smaller dimensions than in the overlying metallization layers. Therefore, metal fuses formed in M1 may have smaller cross-sectional areas.

Figure 3A:
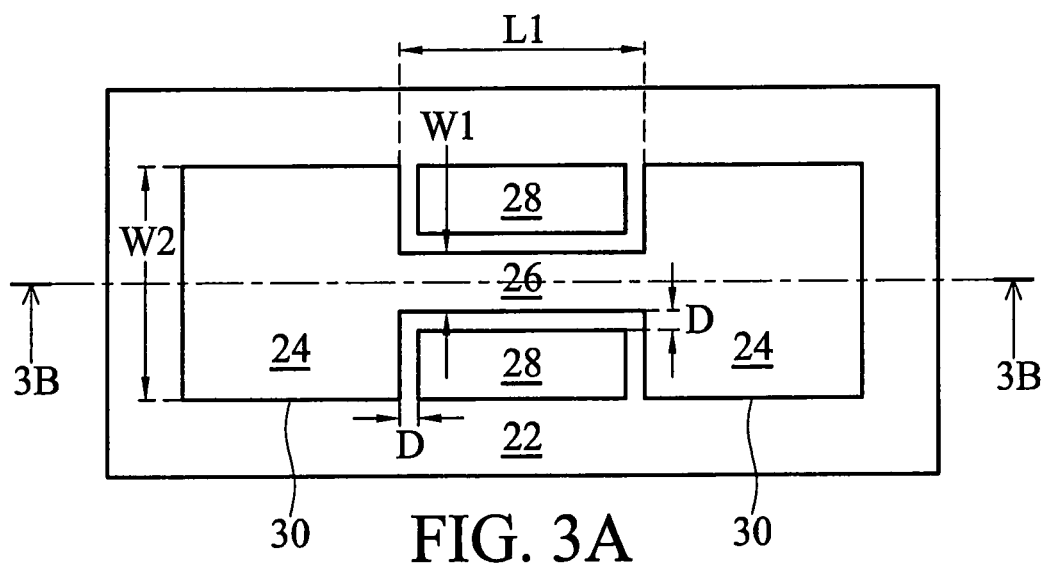

FIG. 3A illustrates a top view of the formation of openings in low-k dielectric layer 22. In the preferred embodiment, the openings include openings 24 for forming contact pads of a metal fuse, and opening 26 connecting openings 24. Opening 26 is for forming a metal fuse element, and thus preferably has a small width W1. In an exemplary embodiment, width W1 is less than about 0.1 μm, and more preferably less than about 0.07 μm. Length L1 of opening 26 preferably ranges from about 0.2 μm to about 5 μm, with a corresponding ratio of length L1 to width W1 between about 2 and about 50. One skilled in the art will realize that the dimensions recited throughout the description are merely examples, and may be reduced accordingly with the scaling of integrated circuit.

To sustain the blowing current without incurring damage, the contact pads of the metal fuses preferably have a substantially greater width than the width of the metal fuse elements. Accordingly, openings 24 have an exemplary width W2 of greater than about 1 μm. Dummy openings 28 are formed adjacent to openings 24 and 26. In the preferred embodiment, dummy openings 28 and neighboring openings 24 and 26 have a distance D of less than about 0.1 μm.

Figure 3B:
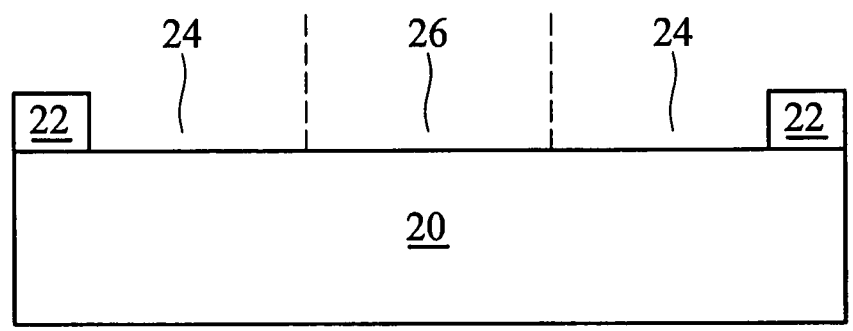
Figure 4:
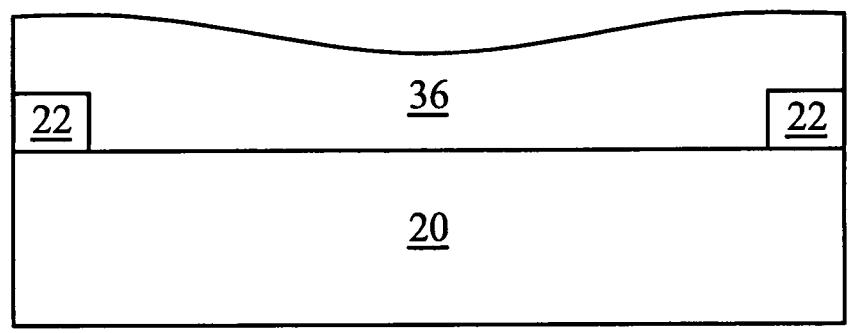

FIG. 3B illustrates a cross-sectional view of the embodiment shown in FIG. 3A, wherein the cross-sectional view is taken from a plane crossing line 3B-3B. A conductive material 36 is filled into openings 24, 26 and 28, as illustrated in FIG. 4. Conductive material 36 preferably includes copper or copper alloys, although other metals such as aluminum, tungsten, silver, and the like, may be included. As is known in the art, the filling of openings 24, 26 and 28 preferably includes forming a diffusion barrier layer (not shown) in the openings, forming a seed layer on the diffusion barrier layer using electroless plating, and then filling the openings using electro-plating. In the resulting structure, a top surface of conductive material 36 is higher than the top surface of dielectric layer 22.

Figure 5A:
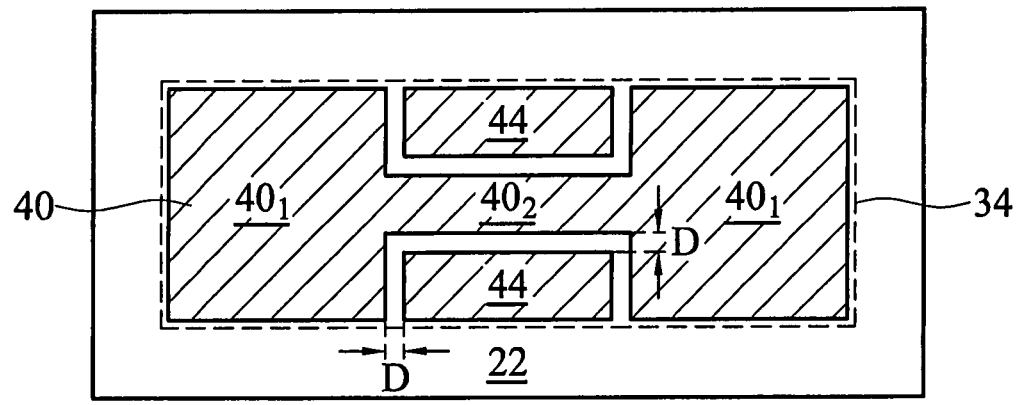
Figure 5B:
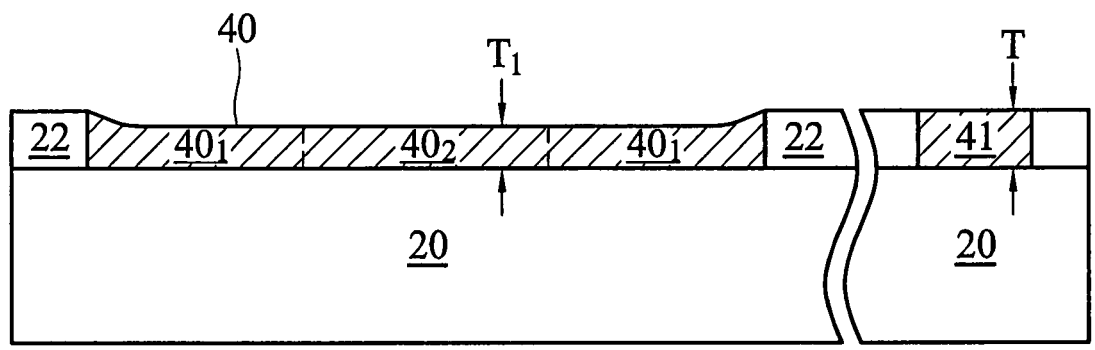

Referring to FIG. 5A, excess conductive material is removed by a chemical mechanical polish (CMP) process. The remaining conductive material forms metal fuse 40, which includes contact pads $40_1$ in openings 24, and fuse element $40_2$ in opening 26. Dummy patterns 44 are formed in dummy openings 28. As is known in the art, in a CMP process for polishing conductive material 36, due to the selectivity of the chemicals in slurries, the metal features, which are selectively attacked by the chemicals, are more likely to be removed than other dielectric materials. Therefore, the regions having high local densities of materials that are selectively attacked will be polished more. Due to the high local pattern density in the fuse region, a dishing effect occurs, and top surfaces of metal fuse 40 and dummy patterns 44 are recessed from the top surface of low-k dielectric layer 22. A cross-sectional view of the structure in FIG. 5A is illustrated in FIG. 5B. Due to the dishing effect, thickness T1 of fuse element $40_2$ is reduced to less than the thickness T of other metal features in the same metallization layer, such as metal line 41, which is not adjacent metal fuse 40. In an exemplary embodiment, the thickness T1 is less than about 15 percent of thickness T. The reduction in thickness T1 will cause a reduction in the cross-sectional area of fuse element $40_1$, and thus the required current for blowing fuse element $40_1$ is reduced.

It is appreciated that metal fuse 40 and dummy patterns 44 are formed simultaneously with the formation of conductive lines and pads in the same metallization layer. In the embodiments discussed in the preceding paragraphs, metal fuse 40, dummy patterns 44 and metal line 41 are formed using single damascene processes. Since the conductive lines and pads will have underlying vias, dual damascene processes can also be used.

Figure 6:
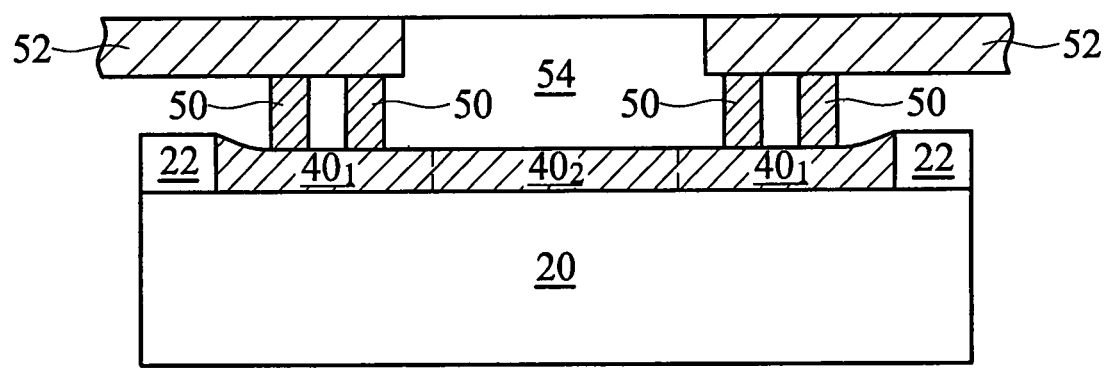

In subsequent process steps, as illustrated in FIG. 6, vias 50 are formed to connect contact pads $40_1$ to overlying metal lines 52. As is known in the art, vias 50 and contact pads $40_1$ are preferably formed in dielectric layer 54, which preferably has a low k value.

As discussed in the preceding paragraphs, to cause the dishing effect to metal fuse 40, the pattern density of the local fuse region is preferably high. In the preferred embodiment, a local fuse region is defined as a region including the metal fuse element and contact pads, as well as spaces defined by extending outer edges of the contact pads. The local pattern density of a local fuse region is the ratio of a total area of all metal features in the local fuse region to the area of the local fuse region. Referring to FIG. 5A, an exemplary local fuse region 34 is shown as a rectangular region defined by the outer boundaries of openings 24 and 28. The local fuse region may further include more surrounding regions. Within the local fuse region, the pattern density of the metal features is preferably greater than about 75 percent, and more preferably greater than about 90 percent, and even more preferably greater than about 95 percent. Dummy patterns preferably fill as much as possible unused area in the local fuse region. Preferably, the local fuse region has a regular shape, such as rectangle, square, circle, and the like. In FIG. 5A, the local pattern density in the local fuse region 34 is calculated as the total area of metal fuse region 40 and dummy patterns 44 divided by an area of local fuse region 34, which has a rectangular shape.

One skilled in the art will realize that the dishing effect is not only related to the local density, but also to the area of the local fuse region. Typically, a larger local fuse region (with a high pattern density) will cause a greater dishing effect. In an exemplary embodiment, the local fuse region has an area of greater than about 1 μm*1.2 μm. In other embodiments, assuming a minimum width of a metal line allowed by the technology for forming the integrated circuits is WM, the local fuse region preferably has an area of greater than about 10 times $WM^2$, wherein $WM^2$ is the minimum unit area of the metal features in the metallization layer in which metal fuses are formed.

To increase local pattern density, dummy patterns are preferably formed to fill spaces in the local fuse region. Dummy patterns are preferably closely located to the metal fuse, so that only small spaces are left therebetween. Referring to FIG. 5A, in a first exemplary embodiment, the distance D between dummy patterns 44 and metal fuse 40 is preferably the minimum distance allowed by the technology used for forming the integrated circuits. For example, in 65 nm technology, distance D is about 0.1 μm.

Figure 7A:
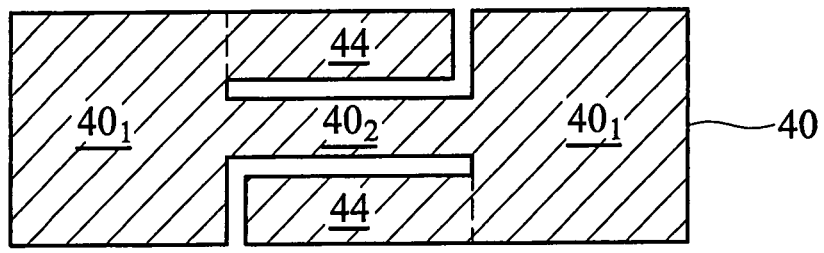
FIGS. 7A through 8C are alternative embodiments of the present invention.
Figure 7B:
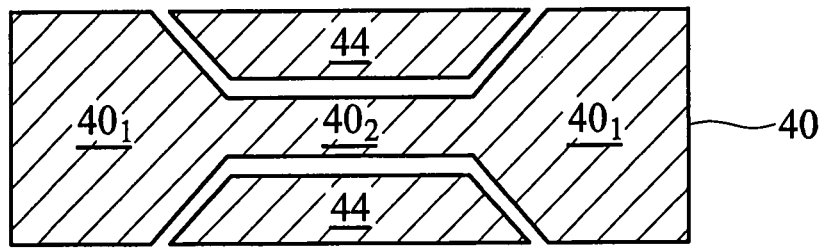
Figure 7C:
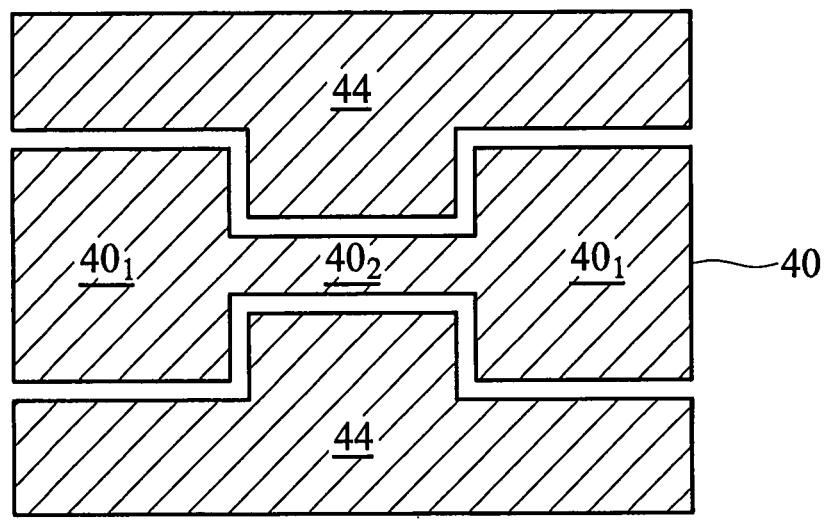

Another method for increasing the pattern density in the local fuse region is to increase the area of dummy patterns. In an exemplary embodiment, a total area of all dummy regions adjacent metal fuse 40 is greater than about 10 percent of the area of metal fuse 40. It is realized that there may be many embodiments for increasing the areas of dummy patterns. FIGS. 7A through 7C are exemplary embodiments of the metal fuses and the dummy patterns. Referring to FIG. 7A, each of the dummy patterns 44 are connected to one, and only one, of the contact pads $40_1$, Since the blowing current does not flow through dummy patterns 44, the required blowing current is not increased. The pattern density, however, is increased.

The metal fuse may have different shapes and sizes. In FIG. 7B, contact pads $40_1$ have reduced widths in the regions adjacent fuse element $40_2$. Accordingly, the shape of dummy patterns 44 is changed to fit the contour of metal fuse 40 in order to keep the local pattern density high. FIG. 7C illustrates yet another embodiment, wherein dummy patterns 44 further extend outward from the spaces between contact pads $40_1$. An advantageous feature of this embodiment is that if the region defined by the outer edges of the metal fuse 40 is small, the size of the dummy patterns 44 may be increased to enlarge the local fuse region. In this case, a ratio of the total area of dummy patterns 44 adjacent metal fuse 40 to an area of metal fuse 40 may be greater than about 0.1, and may even be greater than about 0.2.

Figure 8A:
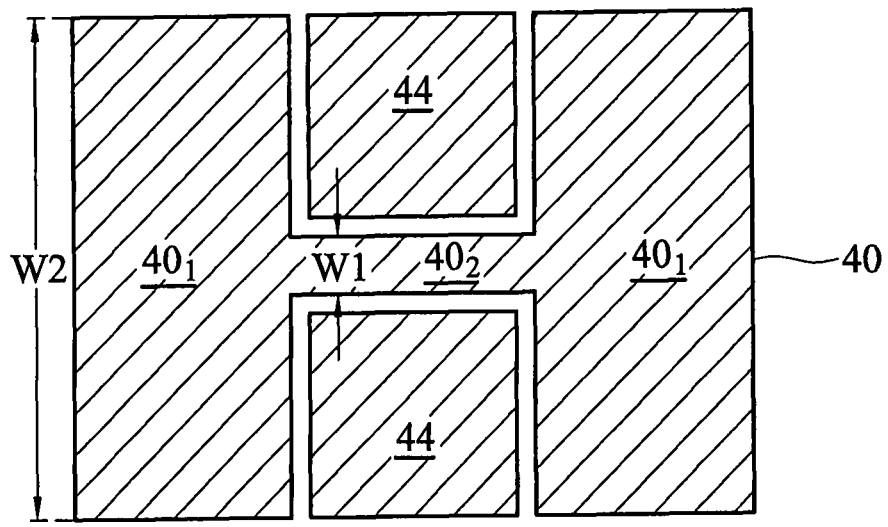
Figure 8B:
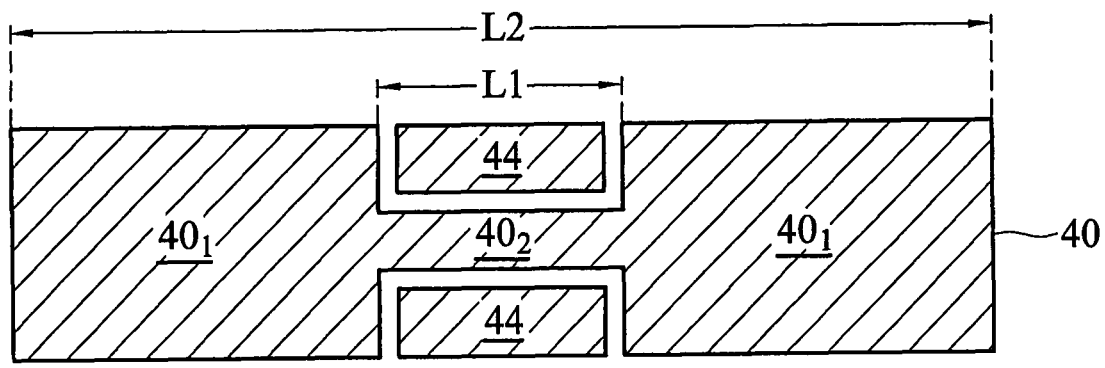
Figure 8C:
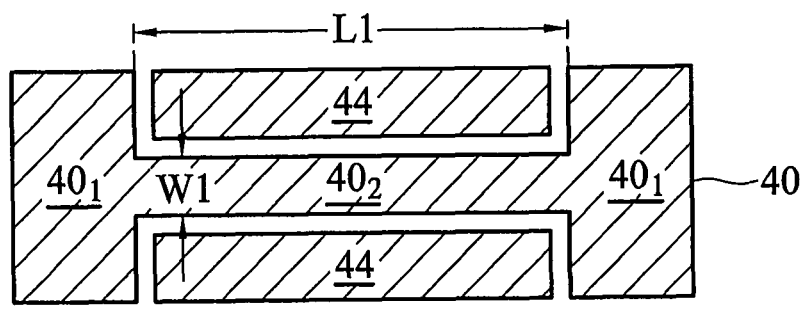

FIGS. 8A, 8B and 8C illustrate yet other embodiments of the present invention, wherein the dimensions of metal fuse 40 are increased to satisfy the requirement for enlarging the local fuse regions and increasing the pattern density in local fuse region. In FIG. 8A, width W2 of contact pads $40_1$ is increased, and thus the local fuse region is enlarged. Dummy regions 44 are enlarged accordingly. Width W1 of fuse element $40_2$, on the other hand, is not increased. In an exemplary embodiment, width W2 and width W1 have a ratio of greater than about 10. In FIG. 8B, length L1 of contact pads $40_1$ is increased to enlarge local fuse region without causing the decrease in the pattern density, while length L1 of fuse element $40_2$ is not increased. In an exemplary embodiment, length L2 and length L1 have a ratio of greater than about 1.2. In FIG. 8C, length L1 of metal fuse element $40_2$ is increased. In an exemplary embodiment, length L1 and width W1 have a ratio of greater than about 2. Again, in FIGS. 8A through 8C, dummy patterns 44 are formed to increase the pattern density.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a planar base layer over a semiconductor substrate;
    a dielectric layer on the planar base layer;
    a metal fuse, having a first thickness from a top surface of the planar base layer to a top surface of the metal fuse, in the dielectric layer;
    a dummy pattern, having a second thickness from the top surface of the planar base layer to a top surface of the dummy pattern, adjacent the metal fuse in the dielectric layer; and
    a metal line, having a third thickness from the top surface of the planar base layer to a top surface of the metal line, in the dielectric layer, the metal line being spaced apart from the metal fuse, laying outside the dummy pattern, and electrically isolated from the metal fuse, wherein the first thickness and the second thickness are each less than the third thickness, wherein the first thickness, the second thickness and the third thickness are measured in a direction perpendicular to an upper surface plane of the semiconductor substrate.

2. The integrated circuit structure of claim 1, wherein the first thickness is less than about 15 percent of the third thickness.

3. The integrated circuit structure of claim 1, wherein a local fuse region comprising the metal fuse therein has a local pattern density of greater than about 75 percent.

4. The integrated circuit structure of claim 1, wherein extended outer edges of the metal fuse form a local fuse region, and wherein remaining spaces in the local fuse region are substantially fully filled with additional dummy patterns.

5. The integrated circuit structure of claim 1, wherein a total area of additional dummy patterns adjacent the metal fuse is greater than about 10 percent of an area of the metal fuse.

6. The integrated circuit structure of claim 1, wherein a distance between the dummy pattern and the metal fuse is less than about 0.1 μm.

7. The integrated circuit structure of claim 1, wherein the metal fuse is in a bottom inter-metal dielectric layer.

8. An integrated circuit structure comprising:
    an inter-metal dielectric layer containing a metal layer on a planar base layer, the planar base layer over a semiconductor substrate, the metal layer having a first thickness from a top surface of the planar base layer to a top surface of the metal layer measured in a direction perpendicular to an upper surface plane of the semiconductor substrate;
    a metal fuse in the inter-metal dielectric layer, the metal fuse comprising:
        a metal fuse element having a second thickness from the top surface of the planar base layer to a top surface of the metal fuse element measured in the direction perpendicular to the upper surface plane of the semiconductor substrate, the second thickness less than the first thickness; and
        a contact pad physically connected to the metal fuse element and having portions coupled to the metal fuse having the second thickness measured in the direction perpendicular to the upper surface plane of the semiconductor substrate;
    a dummy pattern adjacent the metal fuse element and in the inter-metal dielectric layer, the dummy pattern having the second thickness; and
    a local fuse region comprising the metal fuse element, the dummy pattern, and the contact pad.

9. The integrated circuit structure of claim 8, wherein the local fuse region and a minimum unit area of metal features in the inter-metal dielectric layer have a ratio of greater than about 10.

10. The integrated circuit structure of claim 8, wherein a pattern density is greater than about 90 percent.

11. The integrated circuit structure of claim 8, wherein spaces in the local fuse region not filled by the metal fuse are substantially fully filled with additional dummy patterns.

12. The integrated circuit structure of claim 8, wherein the metal fuse further comprises an additional contact pad connected to the metal fuse element, wherein the local fuse region is defined by extending outer edges of the contact pad and the additional contact pad.

13. The integrated circuit structure of claim 8, wherein the metal fuse has a thickness of less than about 15 percent of a thickness of the inter-metal dielectric layer.

14. An integrated circuit structure comprising:
 an inter-metal dielectric layer containing a metal layer on a planar base layer, the planar base layer over a semiconductor substrate, the metal layer having a first thickness from a top surface of the planar base layer to a top surface of the metal layer measured in a direction perpendicular to an upper surface plane of the semiconductor substrate;
 a metal fuse in the inter-metal dielectric layer, the metal fuse comprising:
  a metal fuse element having a second thickness from the top surface of the planar base layer to a top surface of the metal fuse element measured in the direction perpendicular to the upper surface plane of the semiconductor substrate, the second thickness less than the first thickness; and
  two contact pads each physically connected to an end of the metal fuse element each having a portion coupled to the metal fuse element, each of the portions having the second thickness measured in the direction perpendicular to the upper surface plane of the semiconductor substrate;
 a local fuse region defined by extending outer edges of the contact pads, wherein the local fuse region comprises spaces not filled by the metal fuse element and the contact pads; and
 dummy patterns in the inter-metal dielectric layer and filling substantially all of the spaces, wherein the dummy patterns are separated from the metal fuse element and the contact pads, and the dummy patterns have at least a portion thinned to a thickness less than the first thickness.

15. The integrated circuit structure of claim 14, wherein each of the dummy patterns has a distance of less than about 0.1 μm from the metal fuse.

16. The integrated circuit structure of claim 15, wherein the distance is substantially equal to a minimum distance allowed by a formation technology of the integrated circuit structure.

17. The integrated circuit structure of claim 14, wherein the local fuse region has a pattern density of greater than about 75 percent.

18. The integrated circuit structure of claim 14 further comprising additional dummy patterns outside the local fuse region, wherein the additional dummy patterns are adjacent the metal fuse, and wherein a pattern density of a region comprising the local fuse region and the additional dummy patterns is greater than about 75 percent.

19. The integrated circuit structure of claim 18, wherein the additional dummy patterns are physically connected to the dummy patterns.

20. The integrated circuit structure of claim 8, wherein the local fuse region has an area of greater than about 1.2 μm$^2$.

21. The integrated circuit structure of claim 1, wherein a first bottom surface of the metal fuse is substantially leveled with a second bottom surface of the metal line, and wherein the metal fuse and the metal line are formed of a same metallic material.

22. The integrated circuit structure of claim 1, wherein the dielectric layer is an inter-metal dielectric layer.

23. The integrated circuit structure of claim 8, wherein the metal fuse and the dummy pattern are formed of a same metallic material.

24. The integrated circuit structure of claim 14, wherein the metal fuse and the dummy patterns are formed of a same metallic material.

* * * * *